(12) United States Patent
Yu et al.

(10) Patent No.: US 11,942,441 B2
(45) Date of Patent: Mar. 26, 2024

(54) ELECTROSTATIC DISCHARGE PROTECTION CELL AND ANTENNA INTEGRATED WITH THROUGH SILICON VIA

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: HoChe Yu, Hsinchu (TW); Fong-Yuan Chang, Hsinchu (TW); XinYong Wang, Hsinchu (TW); Chih-Liang Chen, Hsinchu (TW); Tzu-Heng Chang, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 199 days.

(21) Appl. No.: 17/480,329

(22) Filed: Sep. 21, 2021

(65) Prior Publication Data
US 2023/0061812 A1 Mar. 2, 2023

(30) Foreign Application Priority Data
Aug. 30, 2021 (CN) .......................... 202111005963.7

(51) Int. Cl.
*H01L 23/60* (2006.01)
*H01L 21/765* (2006.01)
(Continued)

(52) U.S. Cl.
CPC .......... *H01L 23/585* (2013.01); *H01L 21/765* (2013.01); *H01L 21/76885* (2013.01);
(Continued)

(58) Field of Classification Search
CPC ............... H01Q 1/2283; H01Q 9/0407; H01L 27/0248; H01L 2223/6677; H01L 23/60;
(Continued)

(56) References Cited

U.S. PATENT DOCUMENTS 7,260,442 B2 8/2007 Hwang et al.
8,854,777 B2 * 10/2014 Dupuis .................... H03F 1/52
361/111
(Continued)

FOREIGN PATENT DOCUMENTS

KR 10-2012-0089691 8/2012
TW 201027705 7/2010
(Continued)

*Primary Examiner* — Eduardo A Rodela
(74) *Attorney, Agent, or Firm* — Hauptman Ham, LLP

(57) ABSTRACT

A semiconductor device includes a through-silicon via (TSV) in a TSV zone in a substrate and the TSV extends through the substrate; an ESD cell proximal to a first end of the TSV and in contact with the TSV zone, the ESD cell including a set of diodes electrically connected in parallel to each other; an antenna pad electrically connected to a second end of the TSV; and an antenna electrically connected to the antenna pad and extending in a first direction, the first direction is parallel to a major axis of the TSV. The semiconductor device includes a conductive pillar extending parallel to the TSV at a same side of the substrate as the antenna pad, wherein a first end of the conductive pillar electrically connects to the antenna pad, and a second end of the conductive pillar electrically connects to the set of diodes of the ESD cell.

20 Claims, 10 Drawing Sheets

(51) Int. Cl.
*H01L 21/768* (2006.01)
*H01L 23/48* (2006.01)
*H01L 23/58* (2006.01)
*H01L 27/02* (2006.01)
*H01Q 9/04* (2006.01)

(52) U.S. Cl.
CPC ...... *H01L 21/76898* (2013.01); *H01L 23/481* (2013.01); *H01L 27/0255* (2013.01); *H01Q 9/0407* (2013.01)

(58) Field of Classification Search
CPC ..... H01L 23/66; H01L 23/585; H01L 21/765; H01L 21/76885; H01L 21/76898; H01L 23/481; H01L 27/0255
See application file for complete search history.

(56) References Cited

U.S. PATENT DOCUMENTS

| | | | |
|---|---|---|---|
| 9,256,709 B2 | 2/2016 | Yu et al. | |
| 11,437,708 B2 * | 9/2022 | Huang | H01L 25/50 |
| 11,509,037 B2 * | 11/2022 | Dalmia | H01Q 1/2283 |
| 2010/0237386 A1 | 9/2010 | Lin et al. | |
| 2011/0095367 A1 | 4/2011 | Su et al. | |
| 2012/0061795 A1 | 3/2012 | Yen et al. | |
| 2012/0174359 A1 | 7/2012 | Yang | |
| 2012/0205788 A1 | 8/2012 | Kanaoka et al. | |
| 2013/0075809 A1 | 3/2013 | Hsieh | |
| 2013/0264646 A1 | 10/2013 | Russ et al. | |
| 2014/0040838 A1 | 2/2014 | Liu et al. | |
| 2015/0278429 A1 | 10/2015 | Chang | |
| 2015/0357322 A1 | 12/2015 | Russ et al. | |
| 2017/0271322 A1 | 9/2017 | Russ et al. | |

FOREIGN PATENT DOCUMENTS

| | | |
|---|---|---|
| TW | 201108393 | 3/2011 |
| TW | 201946242 | 12/2019 |
| TW | 202117993 | 5/2021 |

* cited by examiner

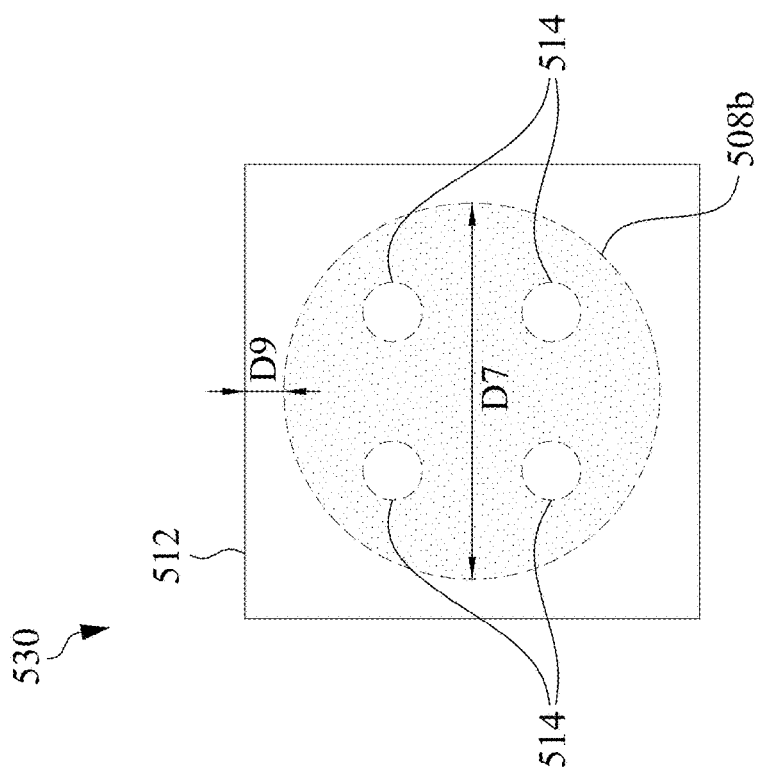
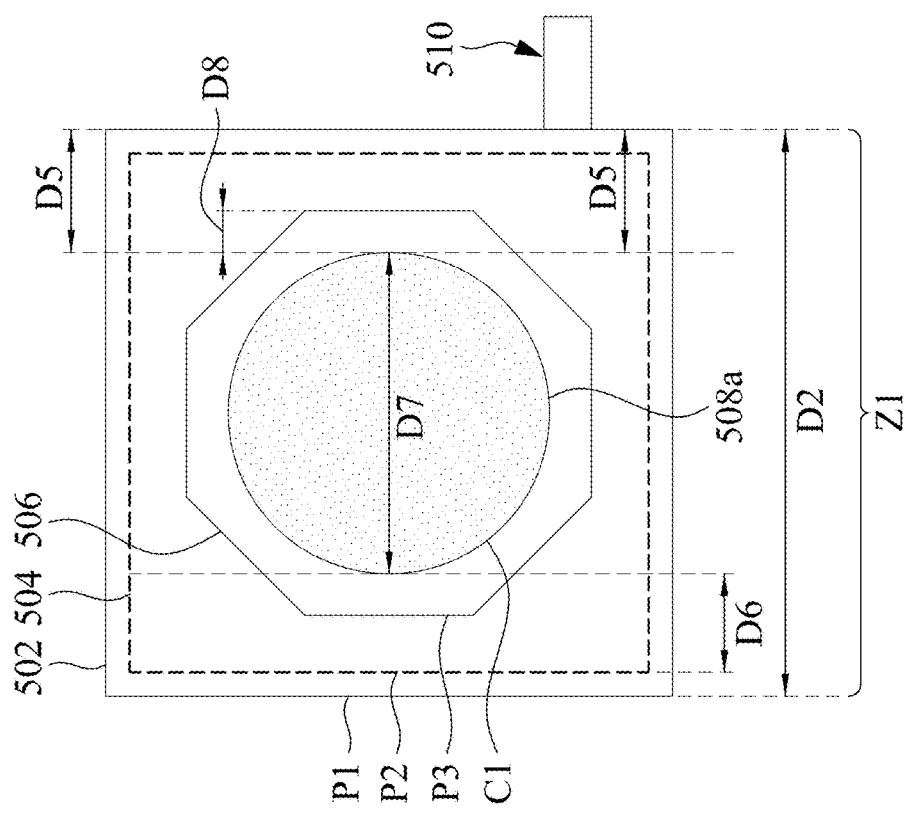
Fig. 5B
Fig. 5A

ELECTROSTATIC DISCHARGE PROTECTION CELL AND ANTENNA INTEGRATED WITH THROUGH SILICON VIA

BACKGROUND

Electrostatic discharge (ESD) in semiconductor devices is associated with increased failure rates in operating semiconductor devices, and increased levels of defectivity and elevated manufacturing costs during a manufacturing process. Semiconductor devices include ESD protection devices to reduce the likelihood of a transient large voltage causing damage to transistors or other circuit elements in a semiconductor device.

Semiconductor devices are manufactured with integrated antennas to send and receive radio frequency (RF) signals to other devices. Antenna leads, which extend across the surface of a semiconductor device, are a source of static electricity buildup and ESD in some manufacturing processes before the semiconductor device is encapsulated and bonded to a circuit board.

In some semiconductor devices, ESD protection devices and integrated antenna leads extend across the surface of a semiconductor device in adjacent areas on a surface of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B are top views of a semiconductor device, in accordance with some embodiments.

DETAILED DESCRIPTION

Figure 1:
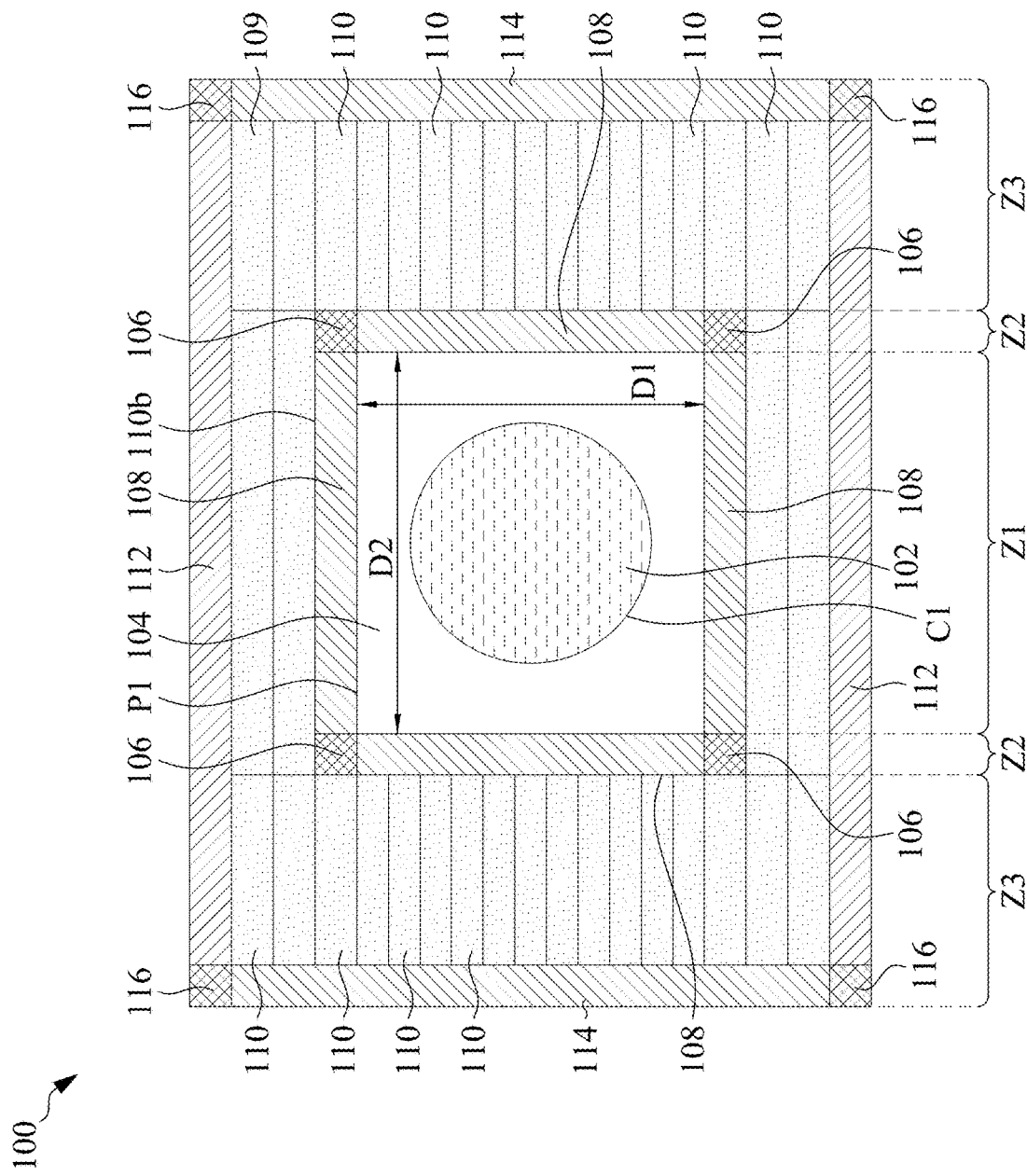
FIG. 1 is a top view of the semiconductor device 100, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In manufacturing semiconductor devices, care is taken in order to prevent damage to the devices caused by transient voltages causing electrical current flow through circuit elements in the semiconductor devices. For example, during a manufacturing process, a semiconductor device is lifted from a carrier, placed in an alignment tool, moved to a processing chamber, and returned to the carrier. Each instance wherein a wafer containing semiconductor devices is manipulated or handled during a manufacturing process presents an opportunity for static electricity to build up on the device and generate a current which moves through portions of the circuit in the semiconductor device. Semiconductor manufacturers include electrostatic discharge (ESD) protection devices in semiconductor devices to protect portions of the circuit from transient voltages and currents moving through portions of the circuit in a semiconductor device.

Further, in some semiconductor devices, antennas are included as part of the device structure in order to facilitate wireless communication between electronic devices. In some instances, semiconductor devices include antennas which are arranged across a surface of a substrate wherein the semiconductor device is located. Similarly, ESD protection in semiconductor devices often includes circuit elements distributed across the surface of a substrate wherein the semiconductor device is located. Thus, the area of a substrate allocated for an antenna or an antenna array, and ESD protection for a semiconductor device is area which is unavailable for other circuit elements such as logic transistors, memory, and so forth.

In some embodiments of the present disclosure, a semiconductor device is described having ESD protection integrated with an antenna array, wherein the ESD protection and antenna array are distributed around a through silicon via (TSV) where the TSV penetrates into a substrate of the semiconductor device. By arranging the ESD protection and antenna array around the TSV in the manner described hereinbelow, more area is made available for circuit elements such as logic transistors, SRAM, and so forth. As a result, an overall size of the semiconductor device is able to be reduced.

FIG. 1 is a top view of the semiconductor device 100, in accordance with some embodiments.

In FIG. 1, a TSV 102 is located within a TSV zone Z1 and has a circumference C1. A TSV zone is a region surround a TSV which provides electrical isolation from other features of the semiconductor device. At a top surface of a substrate, the TSV zone includes a region of the substrate material which is bordered by cells of the semiconductor device (see, e.g., semiconductor device 400 of FIG. 4A). At levels of the semiconductor device manufactured subsequent to the process of making transistors and other circuit elements, the TSV zone includes dielectric material having the same dimensions as the TSV zone at the substrate level of the semiconductor device. TSV zone Z1 includes a TSV zone material 104 has a TSV zone perimeter P1. In semiconductor device 100, TSV zone material 104 is semiconductor material of the substrate through which TSV 102 extends. TSV 102 is located centrally within TSV zone material 104 which has a dimension D1 extending in a first direction and a second dimension D2 extending in a second direction perpendicular to the first direction. According to some embodiments, first dimension D1 is not less than 4 micrometers (μm) and not greater than 6 μm. According to some embodiments, second dimension D2 is not less than 4 μm and not greater than 6 μm. For embodiments having a first dimension D1 and a second dimension D2 greater than about 6 μm, the area of the TSV zone around the TSV does not provide any additional protection from ESD damage or dielectric breakdown between diodes in the ESD protection zone and the TSV. For embodiments having a first dimension D1 and a second dimension D2 smaller than about 4 μm, the semiconductor device is at a greater risk of ESD damage and dielectric breakdown due to the proximity of the TSV to ESD cells in the ESD protection zone. In some embodiments, D1 is equal to D2. In some embodiments, D1 is different from D2.

In semiconductor device 100, ESD protection is provided by diodes (not shown, but see semiconductor device 400 in FIG. 4A) electrically connected in parallel within an ESD protection zone Z2 which extends along TSV zone perimeter P1 and around TSV 102. The diodes in ESD protection zone Z2 located in ESD cells (not shown) which are arranged in contact with each other in the ESD protection zone Z2. In semiconductor device 100, ESD protection zone Z2 includes an array of ESD cells arranged in edges 108 extending around the TSV zone perimeter P1. In semiconductor device 100, the corners of ESD protection zone Z2 include dummy cells which do not include diodes. In some embodiments, the protection zone extending around TSV is square. In some embodiments, an ESD protection zone extending around a TSV is rectangular. In some embodiments, an ESD protection zone extending around a TSV has a non-rectilinear shape. In some embodiments, the corners of ESD protection zones include cells which have diodes for other circuit elements configured for ESD protection. In some embodiments, other circuit elements configured for ESD protection include capacitors.

In semiconductor device 100, a device field area 109 extends around an outer perimeter of ESD protection zone Z2 and further comprises a plurality of field areas 110 and 110b. Field areas 110 have a short side in contact with edges 108 of the array of ESD cells in TSV zone Z2. Field areas 110b have a long side in contact with edges 108 of the array of ESD cells in the TSV zone Z2. In semiconductor device 100, a single field area 110b is in contact with an edge 108 of TSV zone Z2. In some embodiments, multiple field areas 110b are positioned in direct contact with an edge 108 of TSV zone Z2 by a long side thereof. Field areas 110 and 110b have a long dimension and a short dimension to accommodate circuit elements therein. In some embodiments, a field area includes logic transistors. In some embodiments, the field area includes memory cells. In some embodiments, a field area includes capacitors. In some embodiments, a field area includes conductive lines for carrying signals and/or power for the semiconductor device. In some embodiments, the field area is free of circuit elements and provides a buffer around ESD protection zone Z2 in order to protect the semiconductor device from ESD damage.

In semiconductor device 100, field area 109 is surrounded by isolation structures 112, 114, and 116. In some embodiments, isolation structures are manufactured in single manufacturing step and extend continuously around the area 109. In some embodiments, isolation structures 112, 114, and 116 are a dielectric material which has been deposited into a substrate material. Field area 109 and isolation structures 112, 114, 116 are located within device zone Z3 which extends around the outer perimeter of ESD protection zone Z2.

Figure 2:
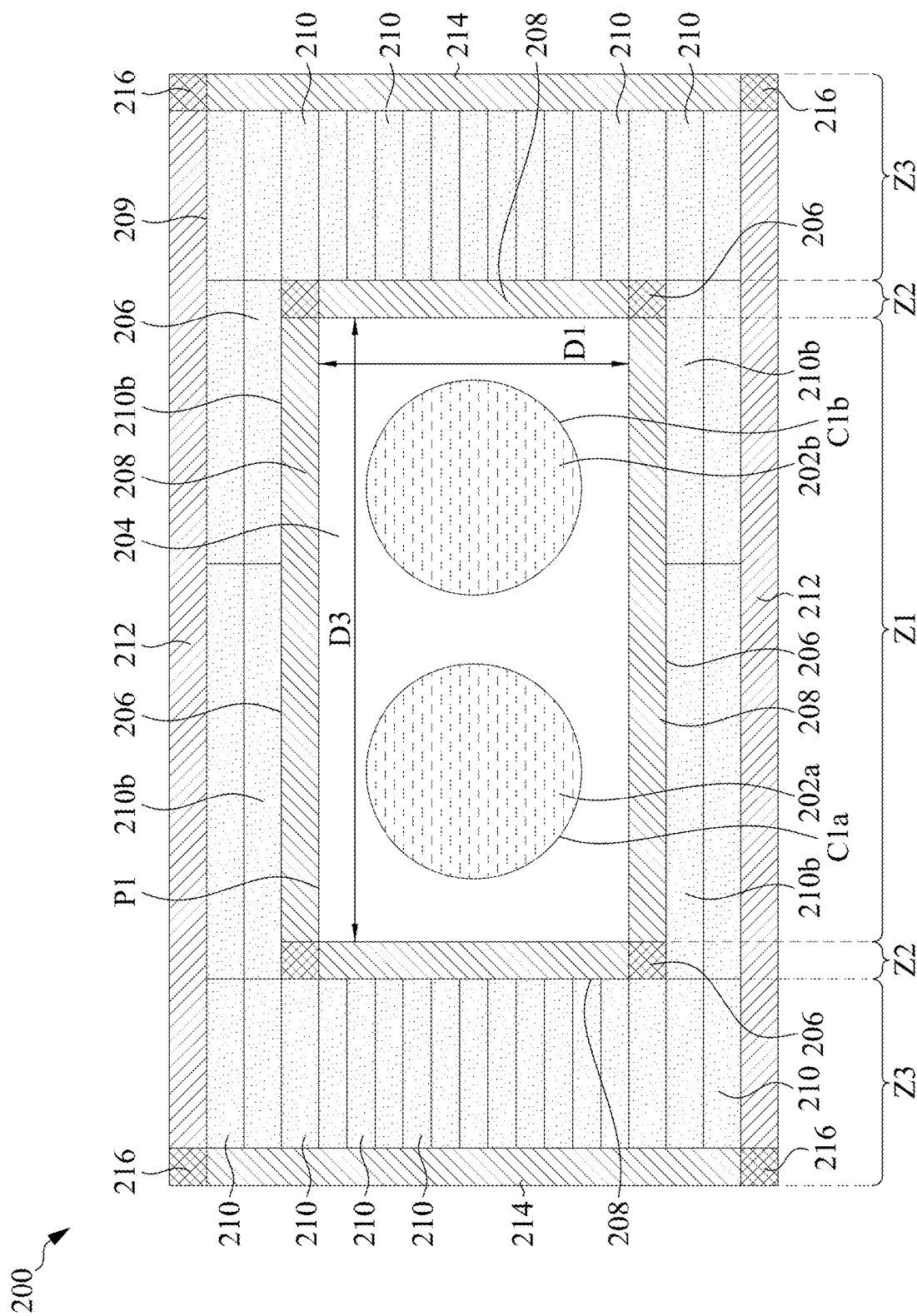
FIG. 2 is a top view of a semiconductor device, in accordance with some embodiments.

FIG. 2 is a top view of a semiconductor device 200, in accordance with some embodiments. Elements of semiconductor device 200 (such as elements 209, 210, 212, 214 and 216) which have a similar structure and function as corresponding elements in semiconductor device 100 have a same identifying numeral, incremented by 100. In semiconductor device 200, TSV zone Z1 includes a first TSV 202a and a second TSV 202b. First TSV 202a has a first TSV circumference C1a. Second TSV 202b has a second TSV circumference C1b. TSV zone Z1 has a first dimension D1 extending in a first direction 298 and a second dimension D3 extending in a second direction 299 perpendicular to the first direction 298. In semiconductor device 200, second dimension D3 is approximately twice as large as first dimension D1.

In semiconductor device 200, multiple field areas 210b are arranged with a long side of the field area 210b in contact with the edge 208 of the TSV zone Z2. In some embodiments, a single field area 210b is arranged with a long side of the field area 210b in contact with the edge 208 of the TSV zone Z2.

Semiconductor device 200 includes two TSVs: first TSV 202a and second TSV 202b. A semiconductor device which includes multiple TSVs exhibits greater space saving by the inclusion of vertically arranged antennas electrically connected to an antenna pad (see, e.g., antenna pad 314 of semiconductor device 300 in FIG. 3, below), and greater space saving for circuit elements which provide protection from ESD, by having a larger ESD cell perimeter in a TSV zone which surrounds two TSVs, as opposed to a single TSV. In some embodiments, as the number of TSVs in a single TSV zone Z1 increases, the number of diodes in the ESD cells (see semiconductor device 400 of FIG. 4A, below) is decreased linearly with the increase in area of the TSV zone Z2, providing similar amounts of ESD protection with decreased area allocated for separation between adjacent TSVs in the semiconductor device. In some embodiments, the number of TSVs included in a single TSV zone Z1 ranges from 1 to 10. In some embodiments, having more than 10 TSVs in a TSV zone Z1 surrounded by a single row of ESD cells decreases the amount of ESD protection for the semiconductor device. In some embodiments, semiconductor devices having ESD cells forming a border around one or more TSVs reduce the area allocated for [1] TSV, [2] TSV zone Z1, and [3] ESD protection by about 30% over semiconductor devices which have separate areas for TSV, TSV isolation, and ESD protection laterally dispersed across the surface of a substrate for the semiconductor device.

Figure 3:
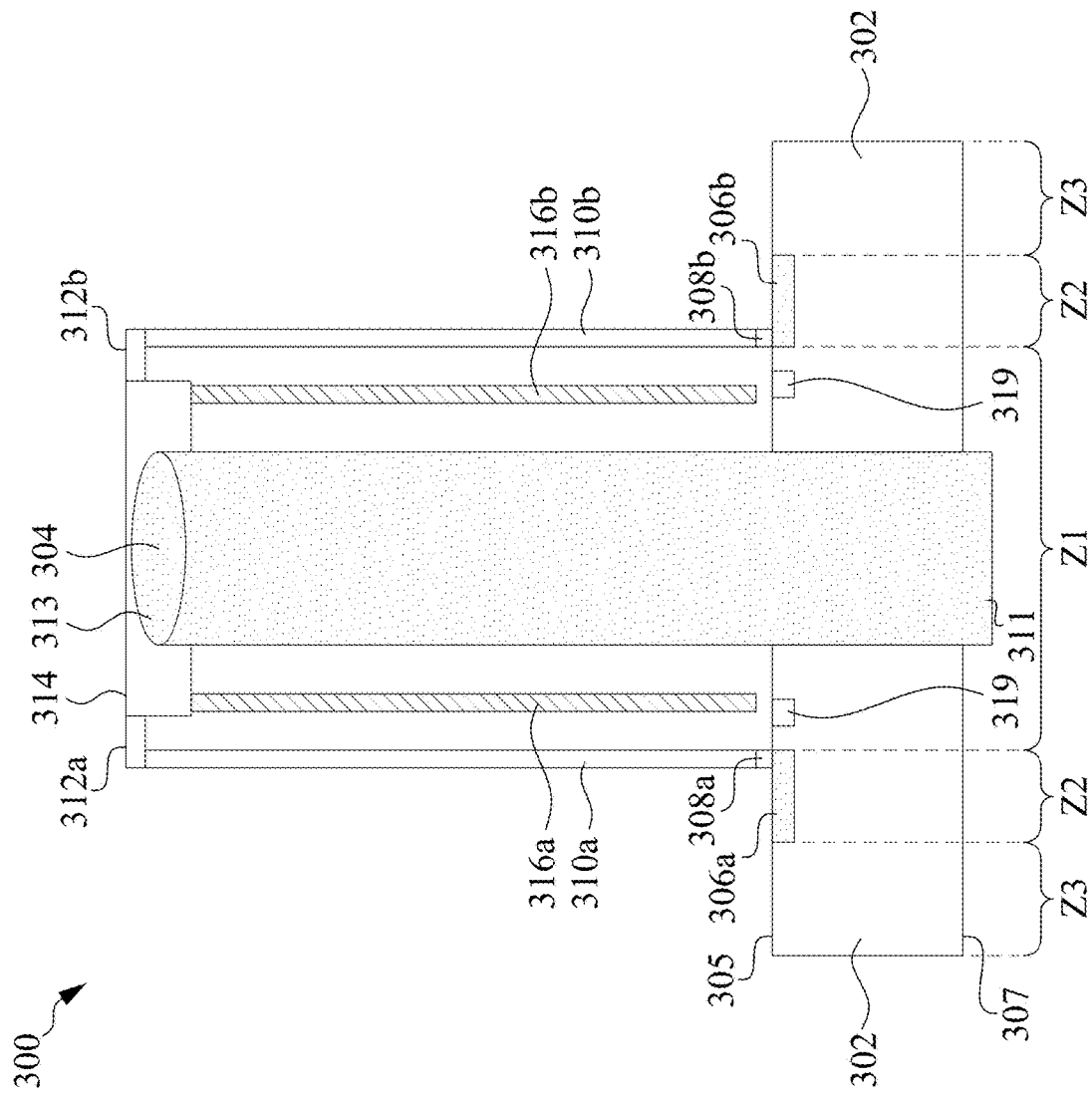
FIG. 3 is a cross-sectional view of a semiconductor device, in accordance with some embodiments.

FIG. 3 is a cross-sectional view of a semiconductor device 300, in accordance with some embodiments. Semiconductor device 100 and semiconductor device 200 are similar in structure to semiconductor device 300. The top views of the semiconductor device 100 and semiconductor device 200 described above are similar to the view of semiconductor device 300 at the top surface 305 of substrate 302, showing the positions of ESD cells (see ESD cell 306a and ESD cell 306b at an opposite side of TSV 304 from ESD cell 306a). TSV 304 extends through substrate 302 from top surface 305 down to bottom surface 307. In semiconductor device 300, the TSV zone Z1, the ESD protection zone Z2, and the device zone Z3 are indicated in a manner similar to the manner used above in the description of semiconductor device 100. In the cross-sectional view of semiconductor device 300, the TSV 304 extends above top surface 305 of substrate 302. In semiconductor device 300, the first end 311 of TSV 304 is at side of substrate 302 opposite from ESD cells 306a and 306b, and the second end 313 of TSV 304 is at the same side of the substrate 302 as ESD cells 306a and 306b. TSV zone Z1 is an exclusion zone in the semiconductor device, where the circuit elements are excluded from the top surface 305 of the substrate 302. In some embodiments, the exclusion zone extends upward along the sides of the TSV to the antenna pad 314. A ground ring 319 is between ESD cells 306a and 306b at the top surface 305 of the substrate and the sidewalls of the TSV 304. In some embodiments, the ground ring 319 extends deeper into the substrate than the ESD cells 306a and 306b. In some embodiments, the ground ring is closer to the TSV 304 sidewalls than a smallest distance between the ground ring 319 and the ESD cells 306a and 306b around the ground ring 319.

An antenna pad 314 is proximal to second end 313 of TSV 304. In semiconductor device 300, antenna pad 314 is in direct contact with second end 313 of TSV 304. In some embodiments, the antenna pad 314 is separated from the second end 313 of a TSV 304 by a layer of dielectric material, and electrically connects to the TSV by at least one contact or via extending from the antenna pad 314 to the second end 313 of the TSV 304.

Antenna pad 314 electrically connects to the ESD cell 306a and 306b in substrate 302 by conductive pillars 310a and 310b, respectively. Conductive pillar 310a electrically connects to ESD cell 306a and conductive line 312a. Conductive pillar 310b electrically connects to ESD cell 306b and to conductive line 312b. Conductive line 312a and conductive line 312b electrically connect to antenna pad 314. In some embodiments, conductive lines electrically connect directly to an antenna pad 314.

In semiconductor device 300, antennas 316a and 316b extend from antenna pad 314 toward substrate 302. Antenna 316a electrically connects to antenna pad 314 in proximity to conductive pillar 310a and is between conductive pillar 310a and TSV 304. Antenna 316b electrically connects to antenna pad 314 at the same side of the substrate as the ESD cells. Antenna 316b is between conductive pillar 310b and TSV 304.

Figure 4A:
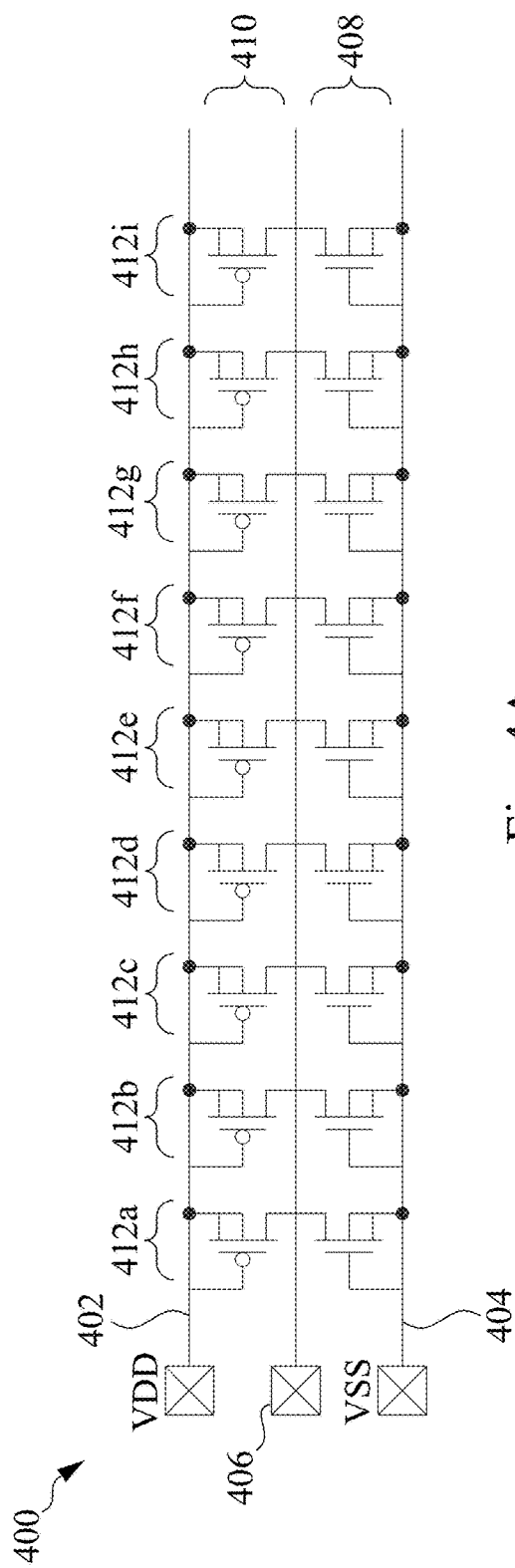
FIGS. 4A-4D are circuit diagrams of an ESD cell, in accordance with some embodiments.

FIG. 4A is a schematic diagram of a semiconductor device 400, in accordance with some embodiments. Semiconductor device 400 includes a first power rail 402 and a second power rail 404. First power rail 402 is a VDD rail and second power rail 404 is a VSS rail. Semiconductor device 400 includes a signal line 406. In some embodiments, signal line 406 acts as the input line for diodes of semiconductor device 400. A first set of transistors 408 includes N-type transistors (NMOS transistors) electrically connected in parallel between the second power rail 404 and the signal line 406. A second set of transistors 410 includes P-type transistors (PMOS transistors) electrically connected in parallel between first power rail 402 and the signal line 406. The first set of transistors 408 and the second set of transistors 410 include a same number of transistors. The transistors in the first set of transistors 408 and the second set of transistors 410 serve as diodes in the semiconductor device 400. Semiconductor device 400 includes diodes 412a-412i which are electrically connected in parallel to each other by first power rail 402, second power rail 404, and signal line 406. In some embodiments, the number of diodes in an ESD cell ranges from not less than two to not more than 20. In some embodiments of ESD cells having only one diode, the current-handling capacity of the ESD cell is insufficiently large to protect the semiconductor device from damage due to electrostatic discharge. In embodiments of ESD cells having more than 20 diodes, the area allocated for the additional diodes (e.g., diodes 21, 22, and so forth) subtracts from the area available for logic transistors, memory, or other circuit elements, and the incremental protection against damage from electrostatic discharge decreases significantly with each additional diode. The diodes of an ESD cell as described herein act as a PN junction for ESD protection, and divert electrical current associated with transient voltages which have sufficient potential (depending on the number of diodes in the ESD cell) to drive current through the diode.

In semiconductor device 400, in response to the voltage carried by signal line 406 being large, with respect to the voltage at first power rail 402 (e.g., VDD), the P-type transistors of the second set of transistors 410 (e.g., P-type transistors of diodes 412a-412i), are activated to conduct current. In semiconductor device 400, in response to the voltage carried by signal line 406 being small, with respect to the voltage at the second power rail 404 (e.g., VSS), the N-type transistors of the first set of transistors 408 (e.g., N-type transistors of diodes 412a-412i) are activated to conduct current.

Figure 4B:
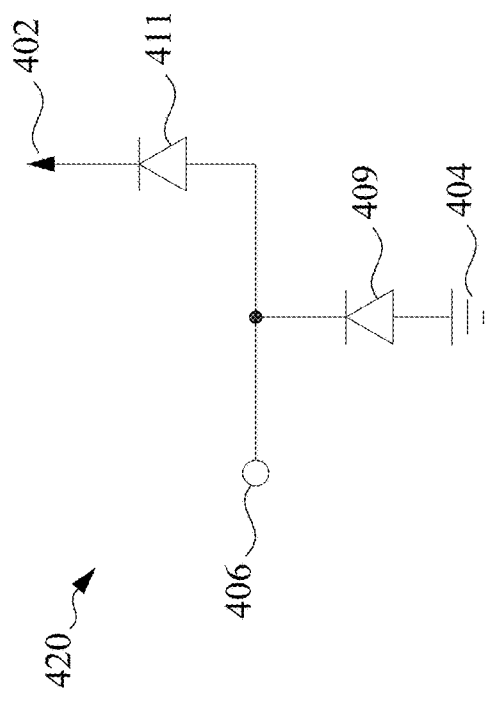

FIG. 4B is a schematic diagram of an ESD cell 420 with a structure similar to the structure of semiconductor device 400, as described above. Elements of ESD cell 420 which have a same structure or function as a corresponding element of semiconductor device 400 have a same identifying numeral, for purposes of clarity. In ESD cell 420, a signal line 406 is electrically connected to the output of a first diode 409 and an input of a second diode 411. An input of first diode 409 is electrically connected to ground (e.g., a second power rail 404). An output from a second diode 411 is electrically connected to a first power rail 402 (e.g., VDD). First diode 409 is functionally equivalent to the second set of transistors 408 of semiconductor device 400. Second diode 411 is functionally equivalent to the first set of transistors 410 of semiconductor device 400.

Figure 4C:
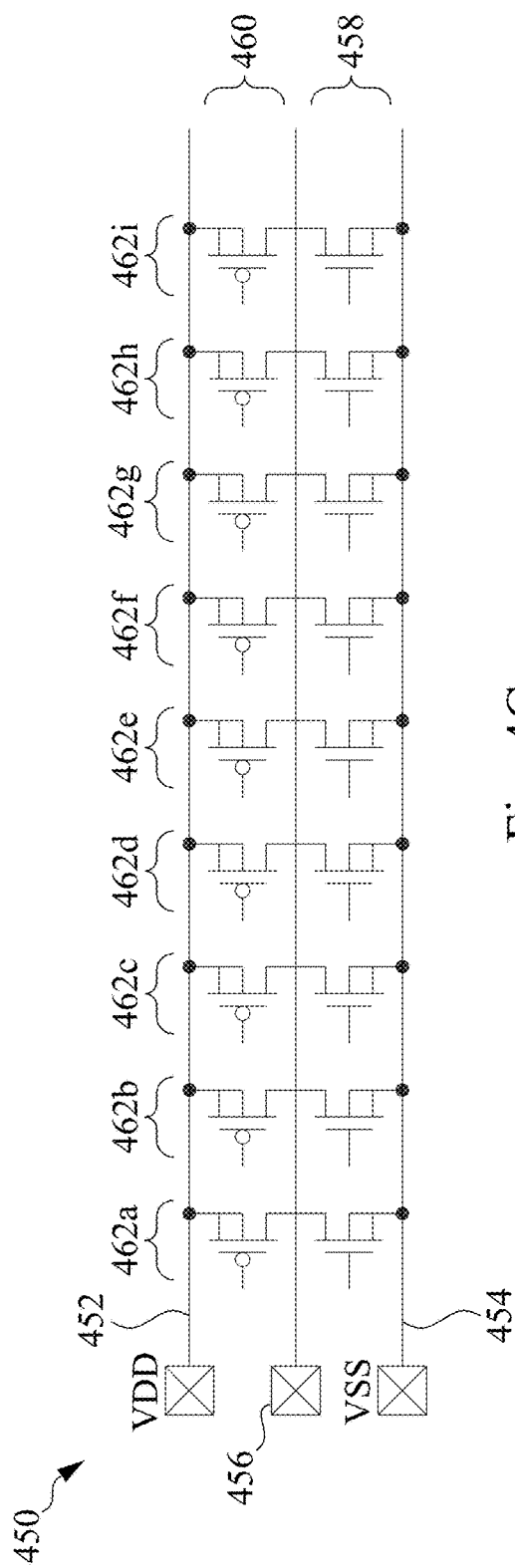

FIG. 4C is a schematic diagram of a semiconductor device 450 in accordance with some embodiments. In semiconductor device 450, elements and structures which have a same structure and function as a corresponding element of semiconductor device 400 have a same identifying numeral, incremented by 50. In semiconductor device 450, the gate electrodes of P-type transistors in the first set of transistors 460 are not electrically connected in parallel to the first power rail 452. The gate electrodes of the P-type transistors are floating gate electrodes. Similarly, in semiconductor device 450, the gate electrodes of N-type transistors in the second set of transistors 458 are not electrically connected in parallel to the second power rail 454. Rather, the gate electrodes of N-type transistors in the second set of transistors 458 are floating gate electrodes.

According to theory and belief, the floating gate electrodes of the P-type transistors of the first set of transistors 460, and the floating gate electrodes of N-type transistors in the second set of transistors 458, have a residual capacitance which is slow to change with respect to the duration of an ESD event which occurs in the semiconductor device 450. Thus, the floating gate electrodes of the P-type transistors of the first set of transistors 460, and the floating gate electrodes of N-type transistors in the second set of transistors 458, apply a bias to the channel regions of the transistors which changes slowly with respect to the duration of an ESD event in the semiconductor device 450, and the transistors of the first set of transistors 460, and the transistors of the second set of transistors 458, function as diodes with a different bias voltage than is present in the semiconductor device 400, where the gate electrodes are tied to the power rails. Thus, semiconductor device 450 presents a different degree of sensitivity to ESD events than semiconductor device 400, and has an interconnect structure in proximity to the transistors of the first set of transistors 460 and the second set of transistors 458 which has reduced complexity in comparison to the interconnect structure in proximity to the first set of transistors 410 and the second set of transistors 408 of semiconductor device 400.

Figure 4D:
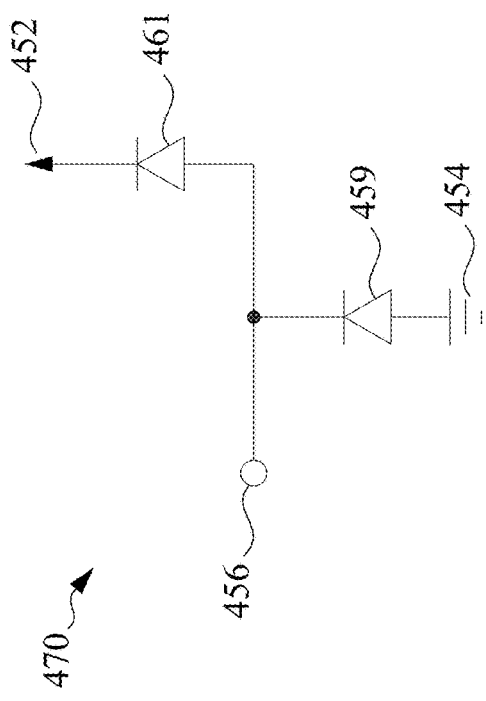

FIG. 4D is a schematic diagram of an ESD cell 470 with a structure similar to the structure of ESD cell 400, as described above. Elements of ESD cell 470 which have a same structure or function as a corresponding element of ESD cell 420 have a same identifying numeral, incremented by 50. In ESD cell 470, a signal line 456 is electrically connected to the output of a first diode 459 and an input of a second diode 461. An input of first diode 459 is electrically connected to ground (e.g., a second power rail 454). An output from a second diode 461 is electrically connected to a first power rail 452 (e.g., VDD). First diode 459 is functionally equivalent to the second set of transistors 458 of semiconductor device 450. Second diode 461 is functionally equivalent to the first set of transistors 460 of semiconductor device 450.

FIG. 5A is a top view of a semiconductor device 500, in accordance with some embodiments.

In semiconductor device 500, a TSV 508a has a circumference C1 within a ground ring 506. TSV 508a has a TSV diameter within dimension D7. Ground ring 506 has a perimeter P3. The cross-sectional view of semiconductor device 500 corresponds to a cross-sectional view taken at a top surface 305 of substrate 302 in semiconductor device 300 as described above.

TSV zone Z1 is an area at the top surface of a semiconductor substrate 502 which contains the ground ring 506. A separation distance D8 is a smallest distance measured between ground ring 506 and the circumference C1 of TSV 508a. According to some embodiments, separation distance D8 is not less than 0.3 µm and not greater than 1 µm. According to some embodiments, a semiconductor device having a separation distance D8 between the ground ring and the TSV which is smaller than 0.3 µm has increased likelihood of dielectric breakdown. According to some embodiments, a semiconductor device having a separation distance D8 between the ground ring and the TSV which is larger than 1 µm has increased likelihood of ESD damage to transistors or circuit elements in the front end of the semiconductor device layout, and/or induced parasitic capacitance which affects transistors or other circuit elements in proximity to a TSV zone around the ground ring in a substrate.

TSV zone Z1 has a perimeter P1 which extends around ground ring 506 and TSV 508a. A separation distance D5 corresponds to a smallest distance between a front end of line (FEOL) exclusion zone (not shown, but corresponding to the shape of TSV zone Z1) around TSV 508a. According to some embodiments, separation distance D5 is not less than 1 µm and not larger than 2 µm. According to some embodiments, semiconductor devices having a separation distance D5 smaller than 1 µm are associated with increased likelihood of dielectric breakdown between the TSV and circuit elements in the transistor region of the semiconductor device. According to some embodiments, semiconductor device having a separation distance D5 larger than 2 µm are associated with increased die area and manufacturing cost without the benefit of increased protection against dielectric breakdown or ESD damage between the TSV and circuit elements (conductive lines or vias) in the back end of a semiconductor device.

A perimeter P2 within perimeter P1 corresponds to a border or outer edge of a back end of line (BEOL) exclusion zone 504 projected on the TSV zone Z1. According to some embodiments, a separation distance D6 is a smallest dimension of the BEOL exclusion zone 504 projected on the TSV zone Z1. According to some embodiments, separation distance D6 ranges from 0.5 µm to 1.5 µm. According to some embodiments, BEOL exclusion zones having a separation distance D6 larger than 1.5 µm is associated with wasted space semiconductor device layout, increasing manufacturing cost and die area. According to some embodiments, BEOL exclusion zones having a separation distance smaller than 0.5 µm are associated with increased likelihood of dielectric breakdown between the TSV and conductive lines or contacts/vias in the back end of the semiconductor device interconnection structure.

ESD cell 510 is in direct contact with perimeter P1 of TSV zone Z1 around TSV 508a. According to some embodiments, ESD cells extend around the entire perimeter P1 of TSV zone Z1. According to some embodiments, ESD cells are in contact with the sides of the TSV zone Z1, and dummy cells are located at the corners of TSV zone Z1.

FIG. 5B is a top view of a semiconductor device 530, according to some embodiments. In semiconductor device 530, an antenna pad 512 is at an end of TSV 508b which is on the same side of the substrate as the ESD cells (see, for example, antenna pad 314 and ESD cell 306a in semiconductor device 300 of FIG. 3). In semiconductor device 530, antenna pad 512 is over the end of TSV 508b. According to some embodiments, an antenna pad is in direct contact with the end of a through silicon via. In some embodiments, an antenna pad is separated from the end of a TSV and is electrically connected to the TSV by a plurality of contacts (see, e.g., contacts 514).

Figure 6:
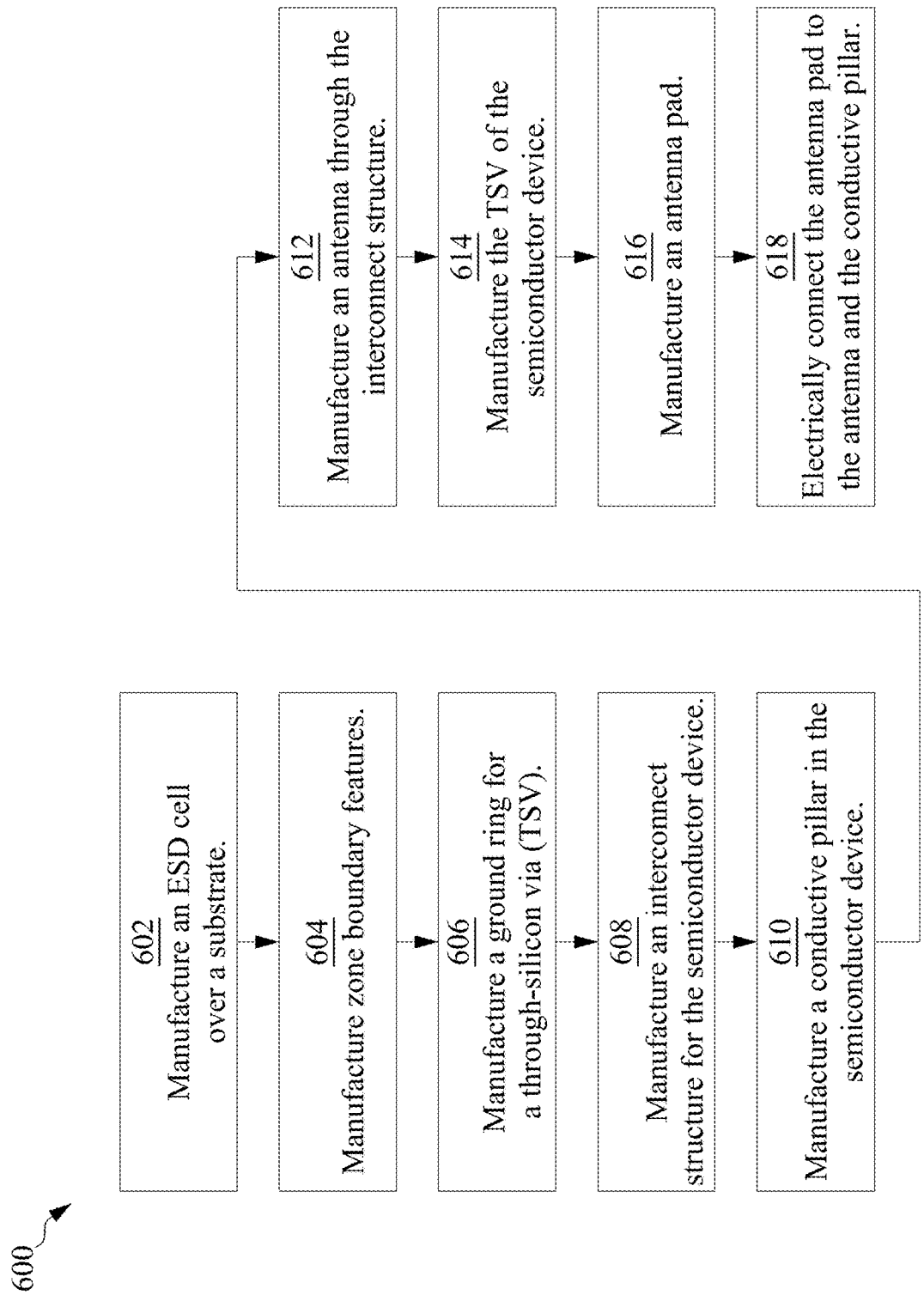
FIG. 6 is a flow diagram of a method of making a semiconductor device, in accordance with some embodiments.

FIG. 6 is a flow diagram of a method of making a semiconductor device in accordance with some embodiments.

Method 600 includes an operation 602, wherein an array of ESD cells are manufactured over a substrate. An ESD cell in a semiconductor device comprises a plurality of diodes electrically connected in parallel in order to modulate currents generated by transient voltages in order to reduce ESD damage. In some embodiments, the diodes in an ESD cell include planar transistors along a top surface of a substrate of semiconductor material. In some embodiments, the diodes in ESD cell include fin field effect transistors (FinFETs) which have fins of semiconductor material etched from a semiconductor material substrate. In some embodiments, diodes in ESD cell include gate all around transistors (GAA transistors) which are manufactured above a substrate. In some embodiments, the semiconductor material of the substrate includes intrinsic silicon, doped silicon, silicon germanium, gallium arsenide, or other semiconductor materials used in manufacturing transistors. In some embodiments, the substrate used for manufacturing GAA transistors includes silicon, silicon germanium, silicon dioxide, a silicon on insulator (SOI) substrate, or some other substrate which is suitable for manufacturing three-dimensional integrated circuits or GAA transistors.

A diode in an ESD cell includes an NMOS transistor electrically connected to a VDD-type power rail and a signal line, and a PMOS transistor electrically connected to the signal line and a VSS-type power rail. In ESD cell having multiple diodes, each NMOS transistor is electrically connected in parallel to the VDD-type power rail and the signal line, and each PMOS transistor is electrically connected in parallel to the VSS-type power rail and the signal line.

In some embodiments, the semiconductor material channel region of the transistors includes intrinsic silicon, silicon germanium, gallium arsenide, or other semiconductor materials known to practitioners of the art.

According to some embodiments, the VSS-type power rail and the VDD-type power rail are on the same side of the substrate. According to some embodiments, the VSS-type power rail and the VDD-type power rail are on opposite sides of the substrate. In some embodiments, power rails are manufactured by copper electrodeposition. In some embodiments, power rails include aluminum or alloys of copper and aluminum.

Method 600 includes an operation 604, wherein an array of zone boundary features are manufactured.

According to some embodiments, zone boundary features include portions of dielectric material which are deposited into openings etched in a semiconductor material substrate in order to electrically isolate elements of the semiconductor device outside the TSV zone from elements of the semiconductor device within TSV zone. For example, according to some embodiments, a zone boundary feature (e.g., an isolation structure) is manufactured by depositing a layer of dielectric material over transistors in the ESD cells and performing an etch process to expose a portion of the semiconductor material or substrate below the dielectric material around a perimeter of the TSV zone. Further etch process is performed in order to form a trench within the semiconductor material or substrate along the perimeter of the TSV zone, and a deposition process is performed in order to add dielectric material into the opening in the substrate or semiconductor material and the opening formed through layer of dielectric material deposited over the ESD cells. Thus, electrical interference between the transistors in the ESD cells, between the TSV, and semiconductor device components such as SRAM or logic transistors outside the TSV zone is reduced. According to some embodiments, deposition of dielectric material into an opening in the substrate or semiconductor material around the perimeter of the TSV zone is performed by a chemical vapor deposition process (CVD process). According to some embodiments, the dielectric material deposited into an opening in the substrate or semiconductor material includes silicon dioxide, silicon nitride, silicon oxide-nitride, and so forth. According to some embodiments, a high-k dielectric material is deposited in the opening in the substrate or semiconductor material to electrically isolate the TSV and/or ESD cells from elements of the semiconductor device by surface of the substrate or semiconductor material outside the TSV zone.

Method 600 includes an operation 606, wherein the ground ring for a through silicon via is manufactured.

According to some embodiments, the ground ring is manufactured by etching an opening in a substrate or semiconductor material around the TSV. In some embodiments, the ground ring is manufactured by etching the substrate or semiconductor material around the TSV and a layer of dielectric material deposited over the ESD cells around the perimeter of the TSV zone. According to some embodiments, the ground ring comprises a conductive material such as titanium, tantalum, platinum, palladium, cobalt, or tungsten deposited into the opening and separated from the substrate or semiconductor material by a liner material. According to some embodiments, line material includes titanium nitride, tantalum nitride, cobalt, silicon nitride, silicon oxide nitride, and so forth. A deposition process in order to form a liner material includes chemical vapor deposition (CVD) or atomic layer deposition (ALD). According to some embodiments, a deposition process to deposit the conductive material for the ground ring is a sputtering process. According to some embodiments, a chemical mechanical polishing (CMP) step is performed in order to remove excess liner material and/or conductive material from the top surface of the substrate and/or layer of dielectric material deposited over the ESD cells.

Method 600 includes an operation 608, wherein an interconnect structure of the semiconductor device is manufactured.

In operation 608, the plurality of layers of dielectric material are deposited over the ESD cells of the semiconductor device, and conductive lines and vias are manufactured in openings therein. According to some embodiments, an interconnect structure in a semiconductor device extends from circuit elements at a surface of the substrate, such as logic transistors, SRAM, and so forth, through a plurality of layers of dielectric material to a top surface of the semiconductor device.

Method 600 includes an operation 610, wherein a conductive pillar is manufactured in the semiconductor device, in accordance with some embodiments.

According to some embodiments, manufacturing a conductive pillar in the semiconductor device is accomplished in conjunction with the manufacture of an interconnect structure of the semiconductor device, where the conductive pillar includes contacts, vias, and conductive lines or conductive line segments which extend from the ESD cells toward an end of the TSV above the ESD cells. According to some embodiments, manufacturing a conductive pillar in the semiconductor device includes manufacturing an ESD high aspect ratio contact (ESD HARC). A high aspect ratio contact, or HARC, is manufactured by performing an etch process through multiple layers of a semiconductor device such that the opening formed for the HARC has a smooth and/or continuous sidewall from the top to the bottom of the ESD HARC. According to some embodiments, a liner material is deposited in the opening for the ESD HARC, and a conductive material is deposited in the opening. According to some embodiments, the conductive material for the ESD HARC includes copper, aluminum, cobalt, tungsten, platinum, palladium, and so forth.

Method 600 includes an operation 612, wherein an antenna is manufactured through the interconnect structure.

According to some embodiments, manufacturing an antenna through the interconnect structure includes manufacturing an antenna high aspect ratio contact (antenna HARC) within the BEOL exclusion zone between the conductive pillar and a sidewall of the TSV. A high aspect ratio contact, or HARC, is manufactured by performing an etch process through multiple layers of a semiconductor device such that the opening formed for the antenna HARC has a smooth and/or continuous sidewall along a substantial portion of the antenna HARC sidewall. According to some embodiments, a liner material is deposited in the opening for the antenna HARC, and a conductive material is deposited in the opening over the liner. According to some embodiments, the conductive material for the antenna HARC includes copper, aluminum, cobalt, tungsten, platinum, palladium, and so forth. In some embodiments, deposition of the liner is performed by, e.g., a chemical vapor deposition process or an ALD process. In some embodiments, deposition of the conductive material into the antenna HARC is performed by a sputtering process According to some embodiments, the antenna HARC is separated from the substrate and/or the layer of dielectric material first deposited over the ESD cells by an etch stop layer. Unlike a conductive pillar HARC, the antenna HARC has a smaller dimension extending parallel to the major axis of the TSV than the conductive pillar, or the portion of the TSV at the same side of the substrate as the ESD cells manufactured in operation 602 of method 600.

Method 600 includes an operation 614, wherein a through silicon via (TSV) is manufactured.

According to some embodiments, manufacturing a TSV through a semiconductor device includes depositing a layer of patterning material over a layer of dielectric material, transferring a pattern to the layer of patterning material, and exposing a top surface of the dielectric material through the openings in the layer of patterning material corresponding to the transferred pattern. Manufacturing a TSV through a semiconductor device further includes performing a first etch process through the layer of dielectric material to expose a substrate below the layer of dielectric material, and performing a second etch process to forming an opening extending through an entirety of the substrate.

Manufacturing a TSV through a semiconductor device further includes depositing a conductive material in the opening through the entirety of the substrate and through the layer of dielectric material. In some embodiments, a TSV is filled with copper, aluminum, or an alloy of copper and aluminum.

Method 600 includes an operation 616, wherein an antenna pad is manufactured.

An antenna pad is manufactured by performing operations related to depositing a layer of patterning material over a layer of dielectric material, transferring a pattern to the layer of patterning material, and exposing a top surface of the dielectric material through the openings in the layer of patterning material corresponding to the transferred pattern. Manufacturing an antenna pad further includes performing an etch process through a layer of dielectric material to expose one of [1] an end of the TSV at the same side of the substrate as the ESD cells, or [2] contacts or vias manufactured in direct contact with the end of the TSV at the same side of the substrate as the ESD cells (see, e.g., contacts 512 in FIG. 5B). Manufacturing an antenna pad further includes adding conductive antenna pad material to the opening formed during the etch process to expose the TSV end of the contacts in direct contact with the TSV. In some embodiments, adding conductive antenna pad material includes adding a liner layer and performing copper electroplating. In some embodiments, adding conductive antenna pad material includes performing a sputtering process fill the antenna pad opening.

Method 600 includes an operation 618, wherein the antenna pad is electrically connected to the antenna and the conductive pillar. In some embodiments, electrically connecting the antenna pad to the antenna is performed during operation 616, wherein the antenna and the TSV are each exposed during deposition of the conductive antenna pad material, or vias electrically connected to the ends of each of the antenna and the pillar.

In some embodiments, the antenna pad is electrically connected to a conductive pillar by a conductive line in the same layer of dielectric material as the antenna pad. In some embodiments, the conductive antenna pad material is added into a trench formed during the process of manufacturing the antenna pad opening over the TSV at the same the antenna pad opening is filled with conductive antenna pad material.

Figure 7:
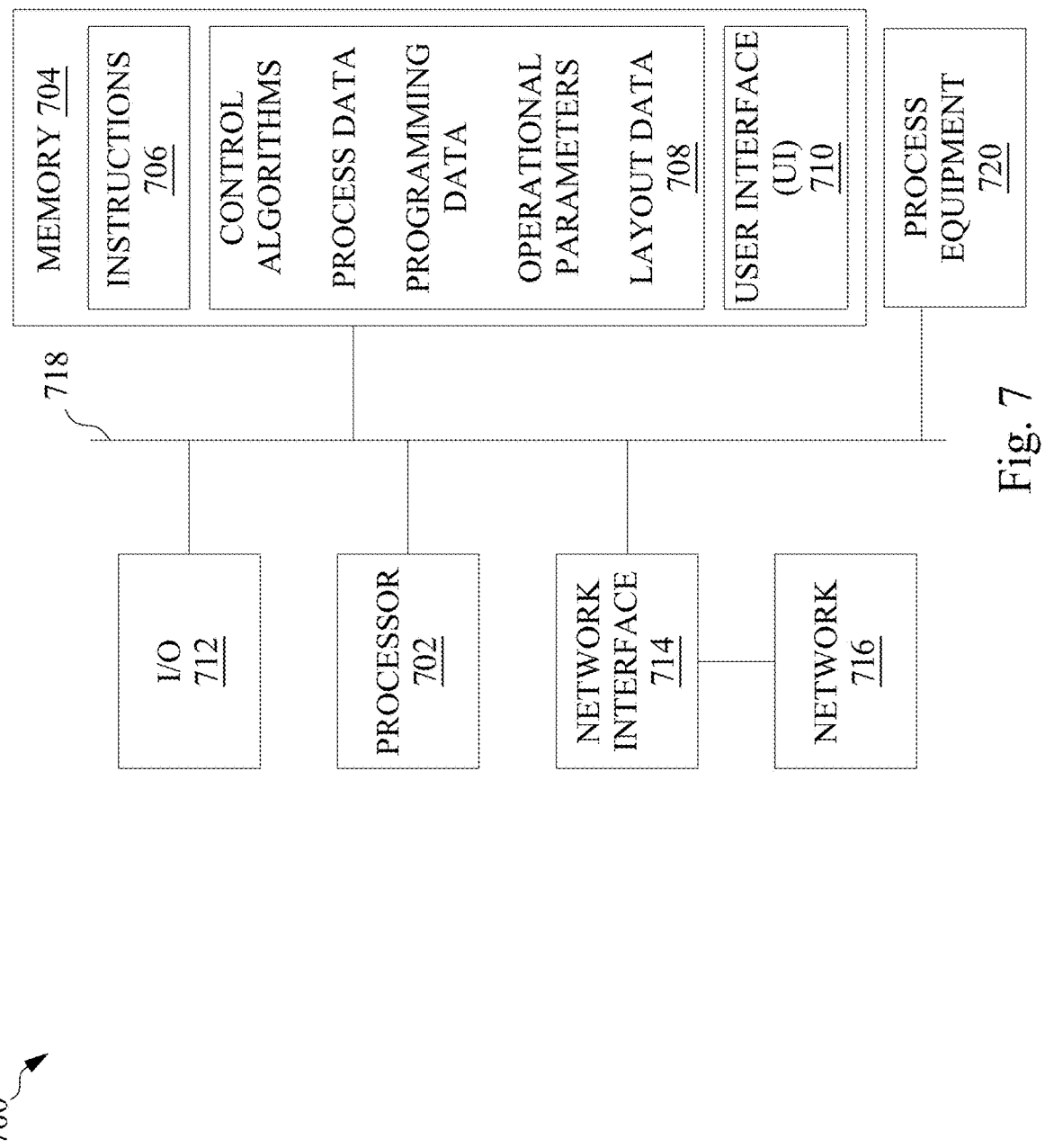
FIG. 7 is a block diagram of an electronic process control (EPC) system, in accordance with some embodiments.

FIG. 7 is a block diagram of an electronic process control (EPC) system 700, in accordance with some embodiments. Methods used for generating cell layout diagrams corresponding to some embodiments of the GAA structures detailed above are implemented, for example, using EPC system 700, in accordance with some embodiments of such systems. In some embodiments, EPC system 700 is a general-purpose computing device including a hardware processor 702 and a non-transitory, computer-readable storage medium 704. Computer-readable storage medium 704, amongst other things, is encoded with, i.e., stores, computer program code (or instructions) 706, i.e., a set of executable instructions. Execution of computer program code 706 by hardware processor 702 represents (at least in part) an EPC tool which implements at least a portion of the methods described herein in accordance with one or more of the structures and methods detailed herein.

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that both the hardware processor 702 and the computer-readable storage medium 704 can connect to external elements via network 716. Hardware processor 702 is configured to execute computer program code 706 encoded in computer-readable storage medium 704 to cause EPC system 700 to be usable for performing at least a portion of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to send information to and receive information from fabrication tools 720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 704.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
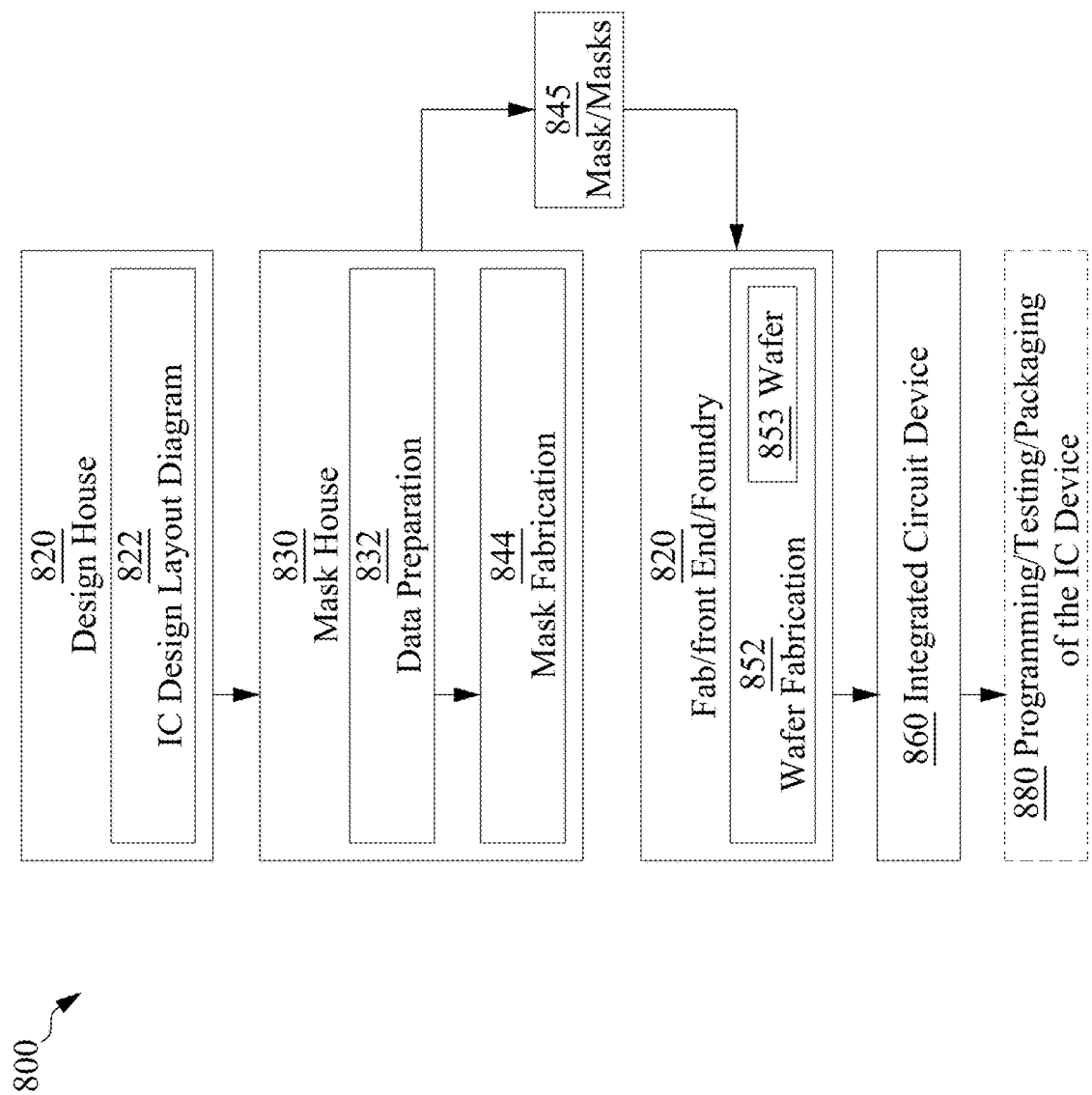
FIG. 8 is a is a block diagram of an integrated circuit (IC) manufacturing system, and an IC manufacturing flow associated therewith, in accordance with some embodiments for manufacturing IC devices.

FIG. 8 is a block diagram of an integrated circuit (IC) manufacturing system 800, and an IC manufacturing flow associated therewith, in accordance with some embodiments for manufacturing IC devices. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. Once the manufacturing process has been completed to form a plurality of IC devices on a wafer, the wafer is optionally sent to backend or back end of line (BEOL) 880 for, depending on the device, programming, electrical testing, and packaging in order to obtain the final IC device products. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 is owned by a single larger company. In some embodiments, two or more of design house 820, mask house 830, and IC Fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks (or photomasks, or reticles) 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask 845 or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders. After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes. IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 845 include a single layer of mask material. In some embodiments, a mask 845 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCL_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures include the nanosheets and/or gate structures of gate-all-around (GAA) devices with the gate structures being embedded in a dielectric support medium covering the sides of the gate structures. In some embodiments, the exposed portions of the gate structures of the functional area are top surfaces and sides of the gate structures that are above a top surface of the dielectric support medium, where the top surface of the dielectric support medium has been recessed to a level below the top surface of the nanosheet stacks, but still covering a lower portion of the sides of the nanosheet stacks.

IC Fab 850 uses mask(s) 845 fabricated by mask house 830 to fabricate IC device 860. Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Figure 9:
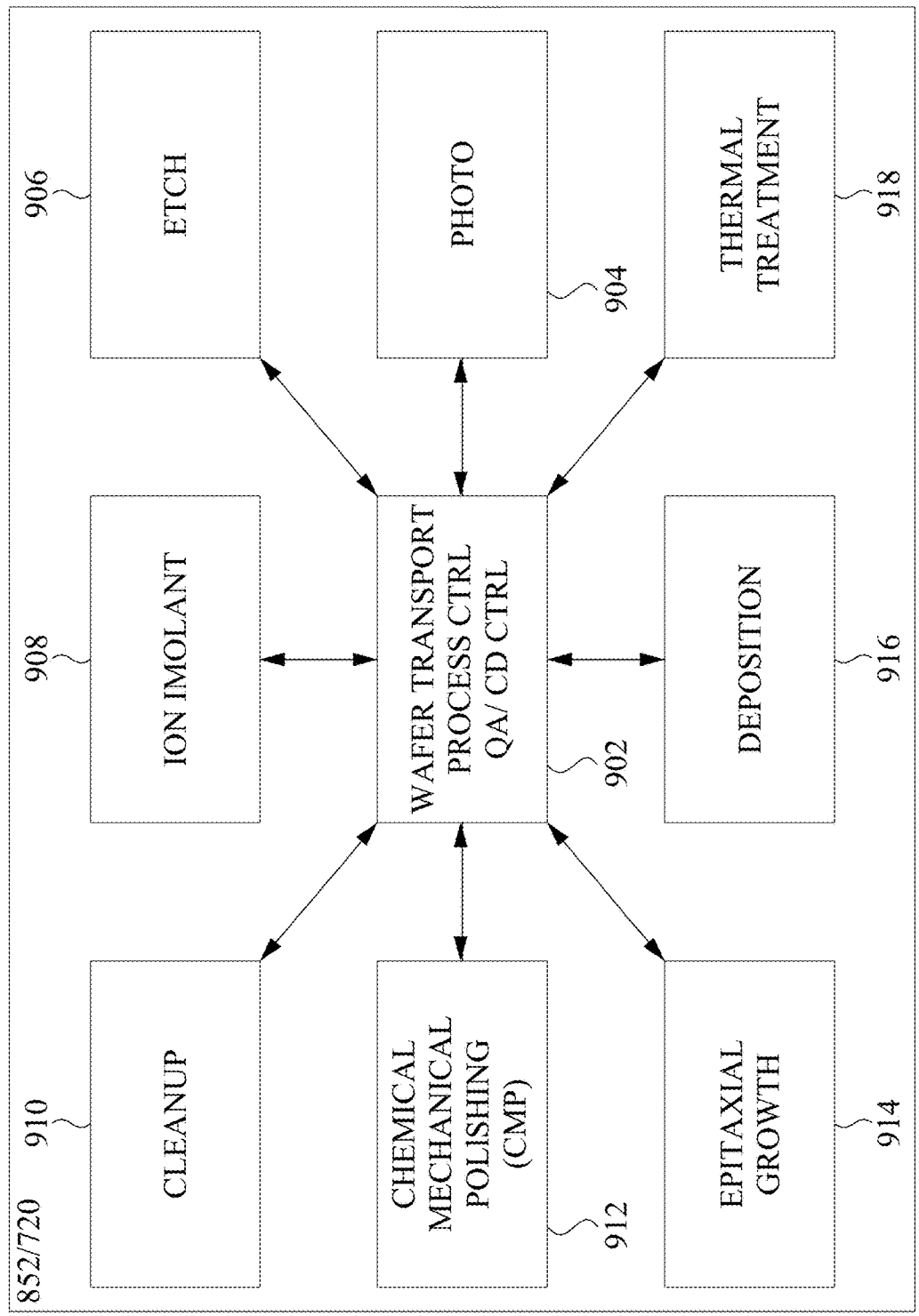
FIG. 9 is a is a schematic diagram of various processing departments defined within a Fab/Front End/Foundry for manufacturing IC devices according to some embodiments.

FIG. 9 is a schematic diagram of various processing departments defined within a Fab/Front End/Foundry for manufacturing IC devices according to some embodiments as suggested in FIG. 7, specifically in data 708 and fabrication tools 720 and FIG. 8, specifically in fab 850. The processing departments utilized in front end of line (FEOL) IC device manufacturing typically include a wafer transport operation 902 for moving the wafers between the various processing departments. In some embodiments, the wafer transport operation will be integrated with an electronic process control (EPC) system according to FIG. 7 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 902 will be the various processing departments providing, for example, photolithographic operations 904, etch operations 906, ion implant operations 908, clean-up/strip operations 910, chemical mechanical polishing (CMP) operations 912, epitaxial growth operations 914, deposition operations 916, and thermal treatments 918.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

In the present disclosure, a semiconductor device is described wherein an antenna array is arranged in a vertical direction (e.g., in parallel with the major axis of a TSV) within the FEOL exclusion zone and BEOL exclusion zone of the semiconductor device around the TSV. The antenna array is arranged partly, or completely, around the circumference of the TSV. A ground ring extends around the TSV at the same level as the substrate top surface in the semiconductor device. ESD protection for the semiconductor device is provided by ESD cells located at the substrate level in the semiconductor device. ESD cells include a plurality of diodes electrically connected in parallel, and connected to an antenna pad at a top end of the TSV (e.g., the end at the same side of the substrate as the ESD cells) by a conductive pillar. The ESD cells are electrically connected to the antenna array by the antenna pad. A number of diodes in the ESD cells ranges from not less than 2 to not more than 20. In some embodiments, the conductive pillar and the antennas of the antenna arrays are high aspect ratio contacts, or HARC structures.

Aspects of the present disclosure relate to a semiconductor device which includes a through-silicon via (TSV) in a TSV zone in a substrate, wherein the TSV extends through the substrate; an ESD cell proximal to a first end of the TSV and in contact with the TSV zone, the ESD cell comprising a set of diodes electrically connected in parallel to each other; an antenna pad electrically connected to a second end of the TSV; an antenna electrically connected to the antenna pad and extending in a first direction, wherein the first direction is parallel to a major axis of the TSV; and a conductive pillar extending parallel to the TSV at a same side of the substrate as the antenna pad in the first direction, wherein a first end of the conductive pillar electrically connects to the antenna pad, and a second end of the conductive pillar electrically connects to the set of diodes of the ESD cell. In some embodiments, the antenna pad is in direct contact with the second end of the TSV. In some embodiments, the antenna is a first separation distance from the TSV, the conductive pillar is a second separation distance from the TSV, and the second separation distance is larger than the first separation distance. In some embodiments, the semiconductor device further includes a set of antenna lines extending parallel to the TSV at the first separation distance from the TSV and distributed through around a circumference of the TSV, wherein the first separation distance is a smaller distance than a smallest distance between the TSV and a perimeter of the TSV zone. In some embodiments, the semiconductor device includes a set of ESD cells proximal to the first end of the TSV, where the set of ESD cells is arranged along a perimeter of the TSV zone and extends around the TSV zone. In some embodiments, a number of diodes in each ESD cell is not less than 2 and not more than 20. In some embodiments, the conductive pillar includes a set of vias and line segments. In some embodiments, wherein the antenna includes a conductive material having a smooth sidewall.

Aspects of the present disclosure relate to a method of making a semiconductor device, including operations for manufacturing an ESD cell for the semiconductor device over a substrate, wherein the ESD cell includes multiple diodes connected in parallel to each other; manufacturing a conductive pillar electrically connected to the ESD cell of the semiconductor device; manufacturing a through-silicon via (TSV) extending through the substrate, wherein the TSV extends through the substrate within a TSV zone having a TSV zone perimeter, and wherein a first end of the TSV is at a same side of the substrate as the ESD cell, and a second end of the TSV is at a different side of the substrate from the ESD cell; manufacturing an antenna extending parallel to the TSV at a same side of the substrate as the ESD cell; and manufacturing an antenna pad electrically connected to the TSV, the antenna, and the conductive pillar. In some embodiments, manufacturing an ESD cell includes manufacturing the ESD cell along the TSV zone perimeter outside the TSV zone. In some embodiments, manufacturing the antennas further includes manufacturing the antennas between the TSV zone perimeter and a sidewall of the TSV. In some embodiments, manufacturing the antennas further includes performing a high aspect ratio contact etch process through dielectric material over the substrate. In some embodiments, the method includes operations for manufacturing a ground ring over the substrate proximal to the ESD cells and to the TSV zone.

Aspects of the present disclosure relate to a semiconductor device which includes a through-silicon via (TSV) extending through a substrate and a TSV zone of a semiconductor device interconnect structure; a set of ESD cells in proximity to a first side of the substrate, wherein the set of ESD cells extend around a circumference of the TSV, and wherein each ESD cell of the set of ESD cells includes a set of diodes electrically connected in parallel, and wherein a first end of the TSV is at the different side of the substrate from the set of ESD cells, and a second end of the TSV is at the same side of the substrate from the set of ESD cells; a set of conductive pillars, wherein a first end of each conductive pillar electrically connects to one ESD cell, and a second end of each conductive pillar is proximal to the second end of the TSV; an antenna pad, wherein the antenna pad is proximal to the second end of the TSV, electrically connects to the second end of the TSV, and electrically connects to conductive pillars of the set of conductive pillars; and a set of antennas extending through the TSV zone parallel to the TSV and electrically connected to the antenna pad. In some embodiments, each ESD cell of the set of ESD cells has a same number of diodes. In some embodiments, a number of diodes in each ESD cell of the set of ESD cells ranges from not less than 2 to not more than 20. In some embodiments, each antenna of the set of antennas further includes an antenna high aspect ratio contact (antenna HARC). In some embodiments, each conductive pillar of the set of conductive pillars further includes an ESD high aspect ratio contact (ESD HARC). In some embodiments, each conductive pillar of the set of conductive pillars further includes a plurality of contacts and conductive lines electrically connecting the corresponding ESD cell of the set of ESD cells to the antenna pad. In some embodiments, the antenna pad is in direct contact with the second end of the TSV. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising;
a through-silicon via (TSV) in a TSV zone in a substrate, wherein the TSV extends through the substrate;
an ESD cell proximal to a first end of the TSV and in contact with the TSV zone, the ESD cell comprising a set of diodes electrically connected in parallel to each other;
an antenna pad electrically connected to a second end of the TSV;
an antenna electrically connected to the antenna pad and extending in a first direction, wherein the first direction is parallel to a major axis of the TSV; and
a conductive pillar extending parallel to the TSV at a same side of the substrate as the antenna pad in the first direction, wherein a first end of the conductive pillar electrically connects to the antenna pad, and a second end of the conductive pillar electrically connects to the set of diodes of the ESD cell.

2. The semiconductor device of claim 1, wherein the antenna pad is in direct contact with the second end of the TSV.

3. The semiconductor device of claim 1, wherein the antenna is a first separation distance from the TSV, the conductive pillar is a second separation distance from the TSV, and the second separation distance is larger than the first separation distance.

4. The semiconductor device of claim 3, further comprising a set of antenna lines extending parallel to the TSV at the first separation distance from the TSV and distributed through around a circumference of the TSV, wherein the first separation distance is a smaller distance than a smallest distance between the TSV and a perimeter of the TSV zone.

5. The semiconductor device of claim 1, further comprising a set of ESD cells proximal to the first end of the TSV, wherein the set of ESD cells is arranged along a perimeter of the TSV zone and extends around the TSV zone.

6. The semiconductor device of claim 1, wherein a number of diodes in each ESD cell is not less than 2 and not more than 20.

7. The semiconductor device of claim 1, wherein the conductive pillar comprises a set of vias and line segments.

8. The semiconductor device of claim 1, wherein the antenna comprises a conductive material having a smooth sidewall.

9. A semiconductor device, comprising:
a through-silicon via (TSV) extending through a substrate and a TSV zone of a semiconductor device interconnect structure;
a set of ESD cells in proximity to a first side of the substrate, wherein the set of ESD cells extend around a circumference of the TSV, and wherein each ESD cell of the set of ESD cells comprises a set of diodes electrically connected in parallel, and wherein a first end of the TSV is at a different side of the substrate from the set of ESD cells, and a second end of the TSV is at the same side of the substrate from the set of ESD cells;
a set of conductive pillars, wherein a first end of each conductive pillar electrically connects to one ESD cell, and a second end of each conductive pillar is proximal to the second end of the TSV;
an antenna pad, wherein the antenna pad
is proximal to the second end of the TSV,
electrically connects to the second end of the TSV, and
electrically connects to conductive pillars of the set of conductive pillars; and
a set of antennas extending through the TSV zone parallel to the TSV and electrically connected to the antenna pad.

10. The semiconductor device of claim 9, wherein each ESD cell of the set of ESD cells has a same number of diodes.

11. The semiconductor device of claim 10, wherein a number of diodes in each ESD cell of the set of ESD cells ranges from not less than 2 to not more than 20.

12. The semiconductor device of claim 9, wherein each antenna of the set of antennas further comprises an antenna high aspect ratio contact (antenna HARC).

13. The semiconductor device of claim 9, wherein each conductive pillar of the set of conductive pillars further comprises an ESD high aspect ratio contact (ESD HARC).

14. The semiconductor device of claim 9, wherein each conductive pillar of the set of conductive pillars further comprises a plurality of contacts and conductive lines electrically connecting a corresponding ESD cell of the set of ESD cells to the antenna pad.

15. The semiconductor device of claim 9, wherein the antenna pad is in direct contact with the second end of the TSV.

16. A semiconductor device, comprising;
a through-silicon via (TSV) in a substrate, wherein the TSV extends through the substrate;
an ESD cell in the substrate, the ESD cell comprising a set of diodes electrically connected in parallel to each other;
an antenna pad electrically connected to the TSV;
an antenna electrically connected to the antenna pad and extending in a first direction, wherein the first direction is parallel to a major axis of the TSV; and
a conductive pillar electrically connecting the antenna pad to the set of diodes of the ESD cell, wherein the antenna is between the TSV and the conductive pillar.

17. The semiconductor device of claim 16, further comprising a second TSV in the substrate, wherein the second TSV is between the TSV and the antenna.

18. The semiconductor device of claim 16, further comprising a semiconductor material surrounding the TSV, wherein the antenna extends through the semiconductor material.

19. The semiconductor device of claim 16, wherein the antenna pad directly contacts the TSV.

20. The semiconductor device of claim 16, further comprising:
a dielectric layer between the antenna pad and the TSV; and
a contact extending through the dielectric layer, wherein the contact electrically connects the TSV to the antenna pad.

* * * * *